United States Patent
Hwang et al.

(10) Patent No.: US 9,411,019 B2
(45) Date of Patent: Aug. 9, 2016

(54) METHOD AND SYSTEM FOR ESTIMATING STATE OF HEALTH OF BATTERY SET

(71) Applicant: Automotive Research & Testing Center, Changhua County (TW)

(72) Inventors: Bo-Han Hwang, Changhua County (TW); Kuo-Liang Weng, Changhua County (TW); Deng-He Lin, Changhua County (TW)

(73) Assignee: Automotive Research & Testing Center, Changhua County (TW)

( * ) Notice: Subject to any disclaimer, the term of this patent is extended or adjusted under 35 U.S.C. 154(b) by 400 days.

(21) Appl. No.: 14/108,318

(22) Filed: Dec. 16, 2013

(65) Prior Publication Data

US 2015/0168498 A1 Jun. 18, 2015

(51) Int. Cl.
*G01R 31/36* (2006.01)

(52) U.S. Cl.
CPC .......... *G01R 31/3624* (2013.01); *G01R 31/362* (2013.01); *G01R 31/3651* (2013.01); *G01R 31/3679* (2013.01)

(58) Field of Classification Search
CPC ......... H04L 67/12; H04L 63/08; H04L 67/10; H04L 67/26; Y10T 428/2982; Y10T 436/111666; Y10T 436/113332; Y10T 436/2575; G01R 31/3606; G01R 31/3634; G01R 31/3651; G01R 31/3675; G01R 31/3679
See application file for complete search history.

(56) References Cited

U.S. PATENT DOCUMENTS

| | | | |
|---|---|---|---|
| 7,548,821 B2 | 6/2009 | Tae et al. | |
| 8,427,112 B2 | 4/2013 | Ghantous et al. | |
| 2007/0194791 A1* | 8/2007 | Huang | G01R 31/3662 324/430 |
| 2012/0022816 A1* | 1/2012 | Zenati | G01R 31/3624 702/63 |
| 2013/0158912 A1 | 6/2013 | Yen et al. | |
| 2014/0278169 A1* | 9/2014 | Kim | G01R 31/362 702/63 |

FOREIGN PATENT DOCUMENTS

| | | |
|---|---|---|
| CN | 101071160 B | 5/2010 |
| CN | 102073016 A | 5/2011 |
| TW | I267647 | 12/2006 |
| TW | I331417 | 10/2010 |
| TW | 201323905 | 6/2013 |
| TW | I398660 | 6/2013 |
| TW | 201326862 | 7/2013 |

* cited by examiner

*Primary Examiner* — Roy Y Yi
(74) *Attorney, Agent, or Firm* — CKC & Partners Co., Ltd.

(57) ABSTRACT

A method and a system for estimating the State of Health (SOH) of a battery set are disclosed. The method utilizes a discrete quantization algorithm to estimate the SOH of the battery set, wherein the voltage standard deviations are calculated according to the loop voltages of the battery cells, and comparing the rated discharge capacity with the voltage standard deviations for estimating the SOH of the battery set.

11 Claims, 4 Drawing Sheets

METHOD AND SYSTEM FOR ESTIMATING STATE OF HEALTH OF BATTERY SET

BACKGROUND

1. Field of Invention

The present invention relates to a method and a system for estimating State of Health (SOH) of a battery set. More particularly, the present invention relates to a method and a system for estimating SOH without building a data base.

2. Description of Related Art

With the trends of environmental protection and energy saving, hybrid technologies related to the Hybrid Power Vehicles (HPVs) develop. HPVs use gaseous fuels or electricity to assist or replace the liquid fuels as the power source of the vehicles; currently, the types of the HPVs include petroleum-hybrid electric driven, pneumatic-hybrid electric driven or electricity driven.

The Petroleum-Hybrid Electric Vehicles (PHEVs) have the advantages of reducing the fuel consumption, and the difference between a PHEV and an ordinary vehicles is that the PHEV have an additional electric motor and additional rechargeable batteries; when the electric motor is driven, a part of the power would be used to drive the tires and a part of the power would be used to charge the rechargeable batteries by a generator for operating the PHEV.

Therefore, how to effectively control the rechargeable batteries and to promote the performance of the rechargeable batteries is currently the research focus of the PHEVs and the electric vehicles (EVs); wherein the Battery Management System (BMS) is the main line within it. The function of the BMS is to estimate the State of Charge (SOC) and the SOH of the rechargeable batteries, for the users to estimate the recharge time, the mileage and the battery life.

However, the conventional manners of the BMS mainly include the open circuit voltage method, the coulomb counting method (i.e., (current) integration method) and the load voltage method, but the abovementioned manners require much time to establish the measurement data base of the rechargeable batteries for estimating the SOC and the SOH of the rechargeable batteries. In addition, the open circuit voltage measurement of the BMS can only be measured when the rechargeable batteries stop charging and discharging, which is very inconvenient for the users.

SUMMARY

Therefore, one of the objectives of the present invention is to provide a method and a system for estimating the State of Health (SOH) of a battery set, to reduce the required time for building the large data base for the conventional BMS. In addition, the present invention utilizes the manner of measuring the loop voltage, rather than the conventional methods of the open voltage measurement or of the internal resistance measurement, to thereby estimate the SOH of the battery set under the discharge process of the battery set without being restricted to estimate under the charge process; and the present invention does not require any specific instrument to measure the temperature or the internal resistance of the battery set in advance.

According to an experiment embodiment of the present invention, a method for estimating a State of Health (SOH) of a battery set is provided. The method includes the following steps: a measuring step, which repeatedly measures a plurality of loop voltages of a plurality of battery cells of the battery set by a plurality of distinct discharge capacities of a predetermined sampling condition; a discretization step, which statistical-distributed-calculates the loop voltages of the battery cells according to a standard deviation formula, to thereby get a plurality of voltage standard deviations, wherein each of the voltage standard deviations corresponding to each of the battery cells; a differential step, which gets a discrete curve according to the discharge capacities and the voltage standard deviations to calculate a standard-deviation-trough-value of the discrete curve by using a differential formula; and an estimating step, which calculates a rated discharge capacity of the battery set and a discharge quantity corresponding to the standard-deviation-trough-value according to a SOH calculating formula, to thereby get the SOH of the battery set.

According to one experiment embodiment of the abovementioned method for estimating the State of Health (SOH) of the battery set, wherein the predetermined sampling condition of the measuring step is to measure the loop voltages of each of the battery cells of the battery set at every hundred milliampere-hour (mAh), and the discharge capacities of the battery set can be obtained by using a coulomb counting method. The standard deviation formula in discretization step is $1/n \sum_{i=1}^{n} X_i - u_i/Z_i$, and $X_i$ is a random variable of the loop voltages, $u_i$ is a mean value corresponding to the loop voltages of each of the battery cells, $Z_i$ is a standard score of values of the loop voltages of each of the battery cells, and n is a total number of the loop voltages corresponding to each of the battery cells. The differential formula in the differential step is $d\sigma(AH)/dAH$, and $\sigma(AH)$ is a function of the voltage standard deviations to the discharge capacities, AH are the discharge capacities. The SOH calculating formula in the estimating step is $k(AH_{valley})/(AH_{original}) \times 100\%$, and k is a constant of proportionality, $AH_{valley}$ is the discharge quantity corresponding to the standard-deviation-trough-value, $AH_{original}$ is the rated discharge capacity of the battery set.

According to an experiment embodiment of the present invention, a system for estimating a State of Health (SOH) of a battery set is provided. The system includes the battery set, a voltage detecting circuit, a current detecting circuit, and an operating module. The battery set has a plurality of battery cells. The voltage detecting circuit is electrically connected to the battery set, and the voltage detecting circuit repeatedly measures a plurality of loop voltages of the battery cells of the battery set by a plurality of distinct discharge capacities of a predetermined sampling condition. The current detecting circuit is electrically connected to the battery set, and the current detecting circuit measures a discharge current of the battery set for calculating the discharge capacities. The operating module is electrically connected to the battery set, the operating module includes a discretization unit, a differential unit and a SOH calculating unit. The discretization unit statistical-distributed-calculates each of the loop voltages of each of the battery cells according to a standard deviation formula, to get a plurality of voltage standard deviations respectively corresponding to each of the battery cells. The differential unit gets a discrete curve according to the discharge capacities and the voltage standard deviations, and the differential unit calculates a standard-deviation-trough-value of the discrete curve by using a differential formula. The SOH calculating unit calculates a rated discharge capacity of the battery set and a discharge quantity corresponding to the standard-deviation-trough-value according to a SOH calculating formula, to thereby get the SOH of the battery set.

According to one experiment embodiment of the abovementioned system for estimating the State of Health (SOH) of the battery set, wherein the predetermined sampling condition is to measure the loop voltages of the battery cells of the battery set at every hundred milliampere-hour (mAh) and the discharge capacities of the battery set can be obtained by a coulomb counting method. The standard deviation formula is $1/n \sum_{i=1}^{n} X_i - u_i/Z_i$, and $X_i$ is a random variable of the loop voltages, $u_i$ is a mean value corresponding to the loop voltages of each of the battery cells, $Z_i$ is a standard score of values of the loop voltages of each of the battery cells, and n is a total number of the loop voltages corresponding to each of the battery cells. The differential formula is $d\sigma(AH)/dAH$; wherein $\sigma(AH)$ is a function of the voltage standard deviations to the discharge capacities, and AH are the discharge capacities. The SOH calculating formula is $k(AH_{valley}/(AH_{original}) \times 100\%$, wherein k is a constant of proportionality, $AH_{valley}$ is the discharge quantity corresponding to the standard-deviation-trough-value, and $AH_{original}$ is the rated discharge capacity of the battery set.

The system for estimating the SOH of the battery set further includes a memory module, a display module, and a load. The memory module is electrically connected to the operating module. The display module is electrically connected to the operating module, and the display module is utilized for displaying the SOH of the battery set. The load is electrically connected to the voltage detecting circuit and the current detecting circuit, for making the load, the battery set, the voltage detecting circuit and the current detecting circuit connected in series to form a loop.

The method and system for estimating the SOH of a battery set which utilize measuring the variation of the standard deviation and the discharge capacities of the loop voltages of the battery cells of the battery set, to obtain the SOH of the battery set, thereby amends the State of Charge (SOC) of the battery set.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
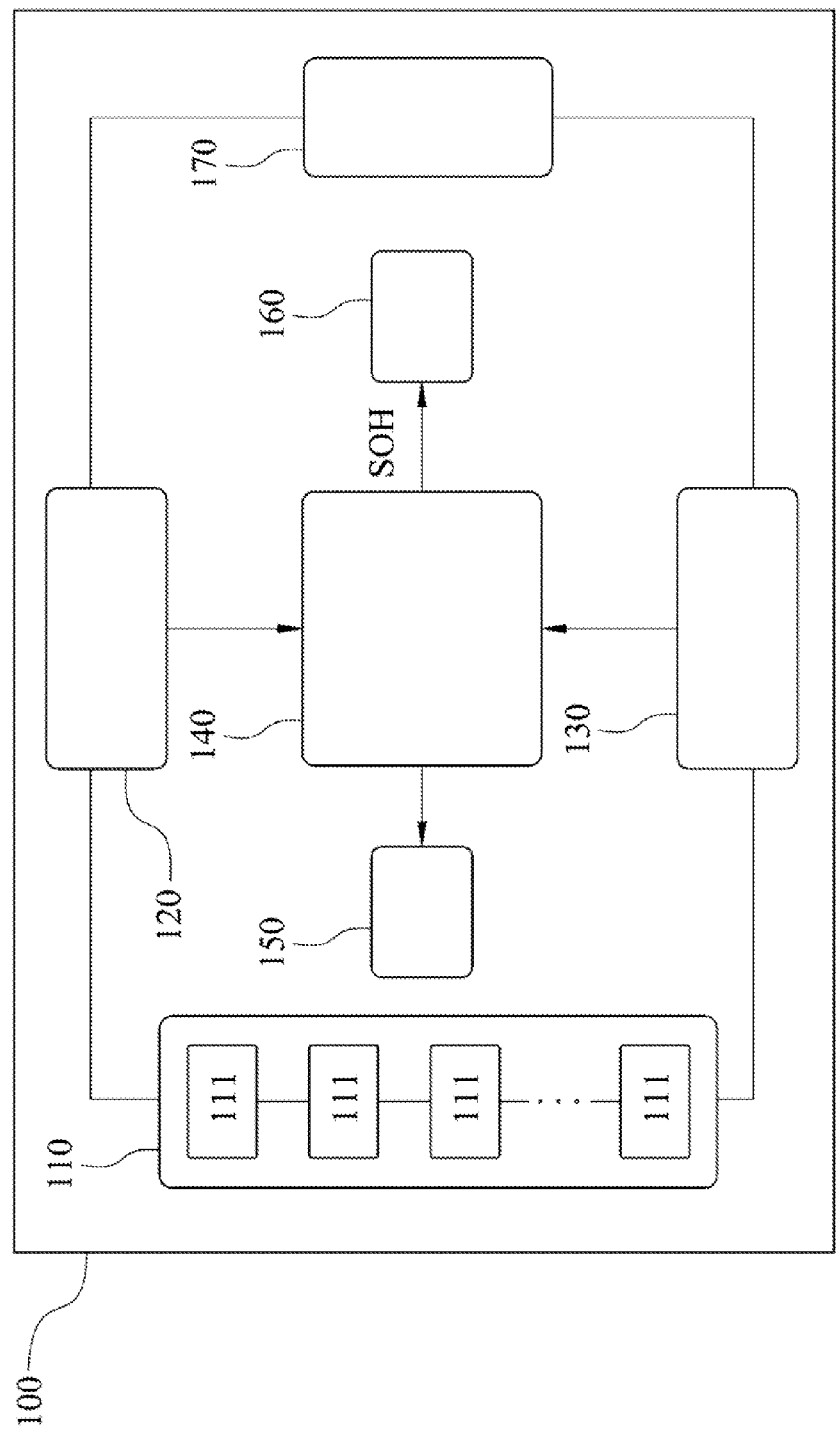
FIG. 1 is a block diagram illustrating a system for estimating a State of Health (SOH) of a battery set according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
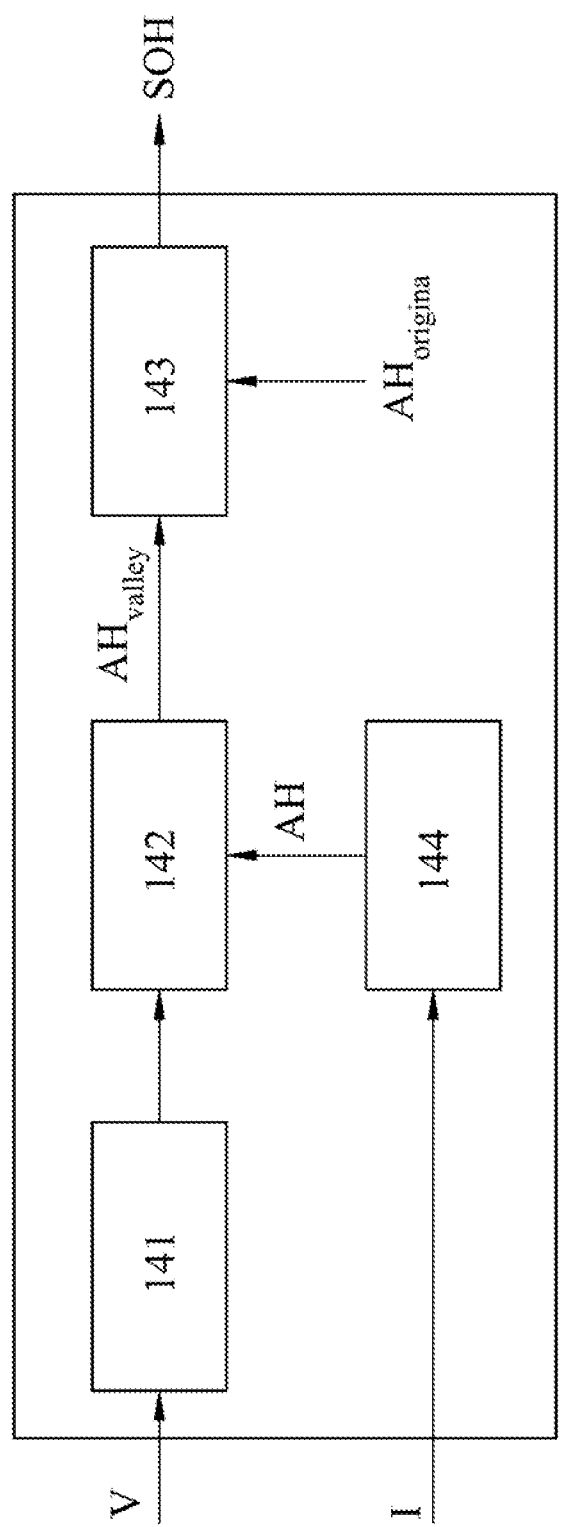
FIG. 2 is a block diagram illustrating the operation module of FIG. 1 according to an embodiment of the present invention.

Please refer to FIG. 1 and FIG. 2; FIG. 1 is a block diagram illustrating a system for estimating a State of Health (SOH) of a battery set according to an embodiment of the present invention. FIG. 2 is a block diagram illustrating the operation module of FIG. 1 according to an embodiment of the present invention. The system for estimating the SOH of a battery set 100 includes a battery set 110, a voltage detecting circuit 120, a current detecting circuit 130, an operating module 140, a memory module 150, a display module 160 and a load 170.

The battery set 110 has a plurality of battery cells 111, the present invention uses a Lithium-Ion Battery (i.e., Li-ion battery or LIB) set as an exemplary embodiment, however it is not for restricting the scope of the present invention.

The voltage detecting circuit 120 is electrically connected to the battery set 110, and the voltage detecting circuit 120 repeatedly measures a plurality of loop voltages V of each of the battery cells of the battery set by a plurality of distinct discharge capacities AH under a predetermined sampling condition. In the following detailed description, at least one actual exemplary embodiments of the predetermined sampling condition will be disclosed.

The current detecting circuit 130 is electrically connected to the battery set 110, and the current detecting circuit 130 measures a discharge current I of the battery set 110, for calculating the discharge capacities AH.

The operating module 140 is electrically connected to the battery set 110, and the operating module 140 includes a discretization unit 141, a differential unit 142, a SOH calculating unit 143, and an integration unit 144.

Regarding to the above description, the discretization unit 141 statistical-distributed-calculates each of the loop voltages V respectively corresponding to each of the battery cells 111 according to a standard deviation formula, to thereby get a plurality of voltage standard deviations, wherein each of the voltage standard deviations respectively corresponding to each of the battery cells 111.

The differential unit 142 gets a discrete curve according to the discharge capacities AH and the voltage standard deviations, to calculate a standard-deviation-trough-value of the discrete curve by using a differential formula.

The SOH calculating unit 143 calculates a rated discharge capacity $AH_{original}$ of the battery set 110 and a discharge quantity $AH_{valley}$ which corresponds to the standard-deviation-trough-value according to a SOH calculating formula, to thereby get a SOH of the battery set 110.

The integration unit 144 calculates the discharge capacities AH according to the discharge current I of the battery set 110.

The memory module 150 is electrically connected to the operating module 140.

The display module 160 is electrically connected to the operating module 140, for displaying the SOH of the battery set 110.

The load 170 is electrically connected to the voltage detecting circuit 120 and the current detecting circuit 130, for making the load 170, the battery set 110, the voltage detecting circuit 120 and the current detecting circuit 130 connected in series to form a loop.

Figure 3:
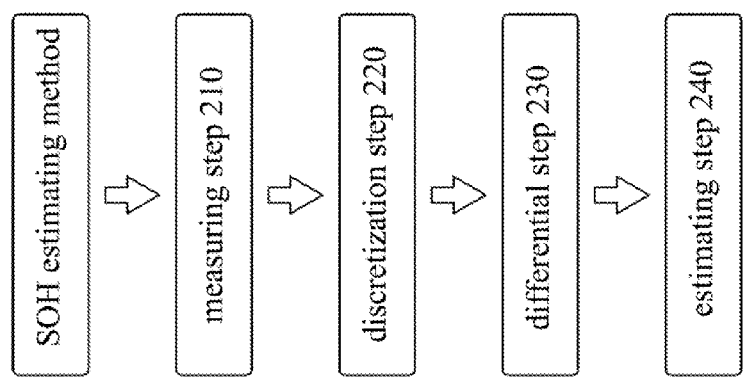
FIG. 3 is a flow chart illustrating a method for estimating a SOH of a battery set according to an embodiment of the present invention.
Figure 4:
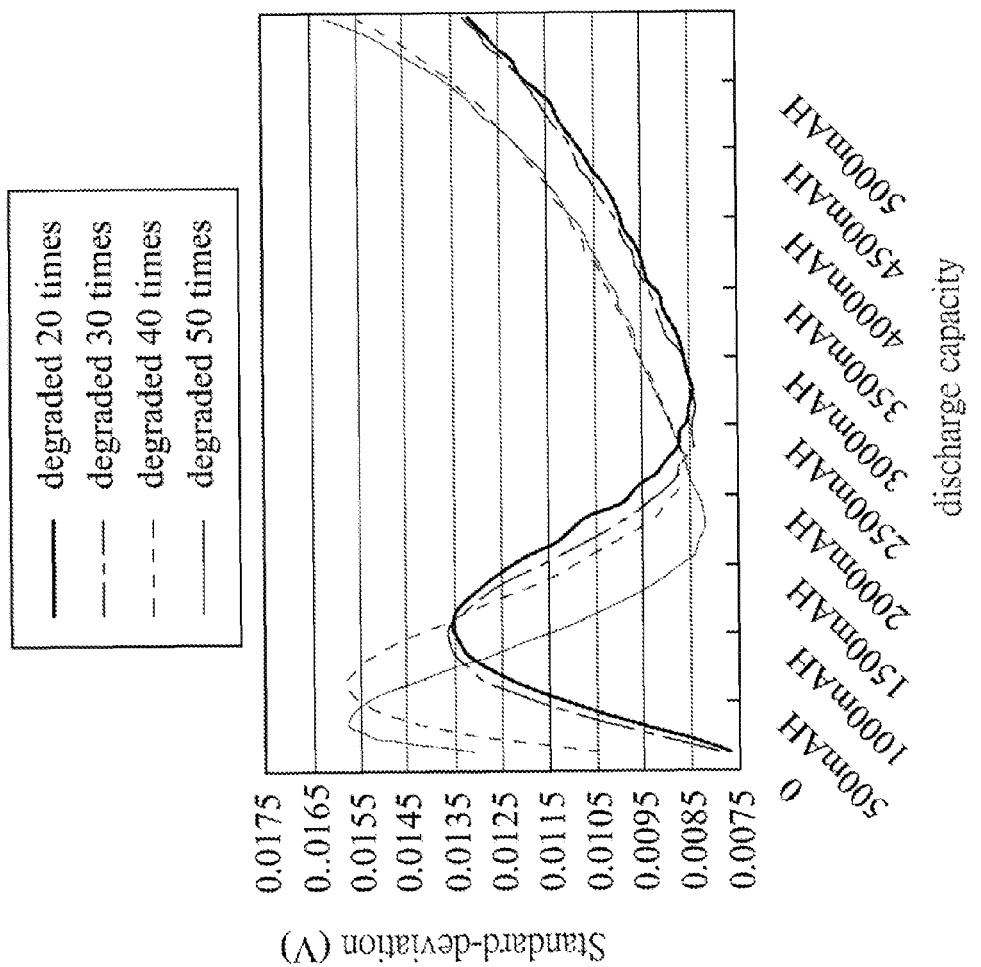
FIG. 4 is a curve diagram of a discrete curve drawn according to an exemplary embodiment of the differential unit in FIG. 2.

In accordance with the aforementioned descriptions, at least one exemplary embodiments of the applied standard deviation formula and of the differential formula will be detailed descripted in the following. Please refer to FIG. 3 in conjunction to FIG. 3 and FIG. 4. FIG. 3 is a flow chart illustrating a method for estimating a SOH of a battery set according to an embodiment of the present invention, and FIG. 4 is a curve diagram of a discrete curve drawn according to an exemplary embodiment of the differential unit in FIG. 2. The battery set 110 of the method for estimating a SOH of a battery set is full charged and is under the process of the following steps of the SOH estimating method; includes:

A measuring step 210, the measuring step 210 utilizes the voltage detecting circuit 120 to repeatedly measure a plurality of loop voltages V of a plurality of battery cells 111 of the battery set 110 by a plurality of distinct discharge capacities AH of a predetermined sampling condition. In this exemplary embodiment, the predetermined sampling condition of the measuring step is to measure the loop voltages V of the battery cells 111 of the battery set 110 at every hundred milliampere-hour (mAh); that is herein under this exemplary embodiment, a hundred mAh is the measuring unit, and every 12 ampere of the battery set 110 is defined as a 1 Current (C), that is, the discharge current I per hour of the battery set 110 is 1200 mA. Specifically, the discharge capacities AH accorded by the voltage detecting circuit 120 can be obtained by calculating the discharge current I measured by the current detecting circuit 130, and the discharge capacities AH can be obtained by using the coulomb counting method.

A discretization step 220, which statistical-distributed-calculates the loop voltages V of the battery cells 111 according to a standard deviation formula, to thereby get a plurality of voltage standard deviations respectively corresponding to each of the battery cells 111. Wherein the standard deviation formula is:

$$\sigma(AH) = \frac{1}{n}\sum_{i=1}^{n}\frac{X_i - u_i}{Z_i},$$

wherein $X_i$ is a random variable of the loop voltages V, $u_i$ is a mean value corresponding to the loop voltages V of each of the battery cells 111, $Z_i$ is a standard score of values of the loop voltages V of each of the battery cells 111, n is a total number of the loop voltages V corresponding to each of the battery cells 111, and n can be an integer from 0 to 1000. In this way, the voltage standard deviations of each of the battery cell 111 an be obtained.

A differential step 230; the differential step 230 get a discrete curve according to the discharge capacities AH and the voltage standard deviations of the measuring step 210, in this exemplary embodiment, as an example, the battery set 110 has been degraded 20 times, 30 times, 40 times, and 50 times for drawing FIG. 4; wherein the discharge capacities AH is the horizontal axis and the voltage standard deviations is the vertical axis. Then the differential formula is utilized for calculating to calculate a standard-deviation-trough-value of the discrete curve. The differential formula is:

$$\sigma(AH)' = \frac{d\sigma(AH)}{dAH};$$

wherein $\sigma(AH)$ is a function of the voltage standard deviations to the discharge capacities AH.

An estimating step 240, which calculates a rated discharge capacity $AH_{original}$ of the battery set 110 and a discharge quantity $AH_{valley}$ corresponding to the standard-deviation-trough-value according to a SOH calculating formula, to thereby get the SOH of the battery set 110. The SOH calculating formula is:

$$SOH = k\frac{(AH_{valley})}{(AH_{original})} \times 100\%;$$

wherein k is a constant of proportionality with a fixed value, $AH_{valley}$ is the discharge quantity exactly corresponding to the standard-deviation-trough-value, $AH_{original}$ is the rated discharge capacity of the battery set 110; and different battery sets 110 would have different constants of proportionality K, the value of constant of proportionality K differs according to types, the brands of the battery set 110, which can be an integer from 0~1000, especially from 1~100 are the better choices. As shown in FIG. 4; the standard-deviation-trough-values of the battery set 110 has been degraded 20 times, 30 times, 40 times, and 50 times correspond to the discharge capacities AH fall within the scope from 1700 mAH to 3300 mAH.

In this way, by using the abovementioned steps the SOH of the battery set 110 can be modified rapidly without building a data base of the battery set 110.

Therefore, from the descriptions of the exemplary embodiments of the present invention, the disclosed method and system for estimating SOH of a battery set have the following advantages:

By measuring the variations of the standard deviations of the loop voltages of the battery cells of the battery set, and by measuring the discharge capacities to obtain the SOH of the battery set, to thereby amend the SOC of the battery set in time, without taking a lot of time for building a data base.

Furthermore, due to the applied loop voltage method in the present invention, estimating the SOH of the battery set under the discharge process of the battery set is hence allowed, and stopping the discharging of the battery set is no more needed.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for estimating a State of Health (SOH) of a battery set, comprising:
    a measuring step, for repeatedly measuring a plurality of loop voltages of a plurality of battery cells of the battery set by a plurality of distinct discharge capacities of a predetermined sampling condition;
    a discretization step, for statistical-distributed-calculating the loop voltages of the battery cells according to a standard deviation formula, to get a plurality of voltage standard deviations, wherein each of the voltage standard deviations corresponding to each of the battery cells;
    a differential step, for getting a discrete curve according to the discharge capacities and the voltage standard deviations, to calculate a standard-deviation-trough-value of the discrete curve by using a differential formula;
    an estimating step, for calculating a rated discharge capacity of the battery set and a discharge quantity corresponding to the standard-deviation-trough-value according to a SOH calculating formula, to get the SOH of the battery set; and
    wherein the SOH calculating formula in the estimating step is $k(AH_{valley})/(AH_{original}) \times 100\%$, and k is a constant of proportionality, $AH_{valley}$ is the discharge quantity corresponding to the standard-deviation-trough-value, and $AH_{original}$ is the rated discharge capacity of the battery set.

2. The method of claim 1, wherein the predetermined sampling condition of the measuring step is to measure the loop voltages of the battery cells of the battery set at every hundred milliampere-hour(mAh).

3. The method of claim 2, wherein the discharge capacities of the battery set in the measuring step are obtained by a coulomb counting method.

4. The method of claim 3, wherein the standard deviation formula in the differential step is $1/n \sum_{i=1}^{n} X_i - u_i/Z_i$, and $X_i$ is a random variable of the loop voltages, $u_i$ is a mean value corresponding to the loop voltages of each of the battery cells, $Z_i$ is a standard score of values of the loop voltages of each of the battery cells, and n is a total number of the loop voltages corresponding to each of the battery cells.

5. The method of claim 4, wherein the differential formula in the differential step is $d\sigma(AH)/dAH$, and $\sigma(AH)$ is a function of the voltage standard deviations to the discharge capacities, AH are the discharge capacities.

6. A system for estimating a State of Health (SOH) of a battery set, comprising:
   the battery set, including a plurality of battery cells;
   a voltage detecting circuit electrically connected to the battery set, the voltage detecting circuit repeatedly measures a plurality of loop voltages of the battery cells of the battery set by a plurality of distinct discharge capacities of a predetermined sampling condition;
   a current detecting circuit electrically connected to the battery set, the current detecting circuit measures discharge current of the battery set for calculating the discharge capacities; and
   an operating module electrically connected to the battery set, the operating module comprises:
      a discretization unit, which statistical-distributed-calculates the loop voltages of the battery cells according to a standard deviation formula, to get a plurality of voltage standard deviations, wherein each of the voltage standard deviations respectively corresponding to each of the battery cells;
      a differential unit, which gets a discrete curve according to the discharge capacities and the voltage standard deviations, to calculate a standard-deviation-trough-value of the discrete curve by using a differential formula; and
      a SOH calculating unit, which calculates a rated discharge capacity of the battery set and a discharge quantity corresponding to the standard-deviation-trough-value according to a SOH calculating formula, to get the SOH of the battery set;
   wherein the SOH calculating formula is $k(AH_{valley})/(AH_{original}) \times 100\%$, and k is a constant of proportionality, $AH_{valley}$ is the discharge quantity corresponding to the standard-deviation-trough-value, $AH_{original}$ is the rated discharge capacity of the battery set.

7. The system of claim 6, wherein the predetermined sampling condition is to measure the loop voltages of the battery cells of the battery set at every hundred milliampere-hour (mAh).

8. The system of claim 7, wherein the discharge capacities of the battery set obtained by a coulomb counting method.

9. The system of claim 8, wherein the standard deviation formula is $1/n \sum_{i=1}^{n} X_i - u_i/Z_i$, and $X_i$ is a random variable of the loop voltages, $u_i$ is a mean value corresponding to the loop voltages of each of the battery cells, $Z_i$ is a standard score of values of the loop voltages of each of the battery cells, and n is a total number of the loop voltages corresponding to each of the battery cells.

10. The system of claim 9, wherein the differential formula is $d\sigma(AH)/dAH$; $\sigma(AH)$ is a function of the voltage standard deviations to the discharge capacities, and AH are the discharge capacities.

11. The system of claim 6, further comprising:
   a memory module electrically connected to the operating module;
   a display module electrically connected to the operating module, for displaying the SOH of the battery set; and
   a load electrically connected to the voltage detecting circuit and the current detecting circuit, is utilized to make the load, the battery set, the voltage detecting circuit and the current detecting circuit connected in series and thereby forms a loop.

* * * * *